United States Patent [19]

Sell

[11] 4,133,050
[45] Jan. 2, 1979

[54] EARLY NOISE PULSE AND LONG DURATION, STABILIZED SWITCHING PULSE

[75] Inventor: Victor L. Sell, Santa Monica, Calif.

[73] Assignee: Ampex Corporation, Redwood City, Calif.

[21] Appl. No.: 793,031

[22] Filed: May 2, 1977

[51] Int. Cl.² ............................................. G11C 11/063
[52] U.S. Cl. ..................................... 365/213; 365/69; 365/129; 365/193; 365/196
[58] Field of Search ................. 340/174 AC, 174 CR, 340/174 M, 174 NC, 174 SC, 174 TB, 174 WA; 365/69, 129, 193, 196, 213

[56] References Cited

U.S. PATENT DOCUMENTS

| 3,513,454 | 5/1970 | Ogrodski | 340/174 AC |
| 3,905,026 | 9/1975 | Sell | 340/174 SC |

*Primary Examiner*—James W. Moffitt

[57] ABSTRACT

A large bit size core memory which maximizes usable flux includes at least one array of low drive toroidal magnetic memory cores, a sense-inhibit conductor pair passing through the array in a given direction to inductively couple all cores in the array, a plurality of perpendicular drive conductors, each passing through the array perpendicular to the sense-inhibit conductor pair and inductively coupling a portion of the cores in the array, a plurality of parallel drive conductors, each passing through the array parallel to the sense-inhibit conductor pair and inductively coupling a portion of the cores in the array, and driving and switching circuitry coupled to drive selected a core during a read portion of a memory cycle with a current which rapidly increases to approximately provide the coercive force MMF to the core and then increases relatively slowly toward the full drive current. The resulting core output switching pulse received by a strobed sense amplifier has an early noise component from delta noise and coupling noise and a subsequent logic 1 switching pulse which is extremely stable with respect to normal variations in temperature and drive current, which has a flat, low magnitude peak that satisfies sense amplifier requirements and which is sufficiently delayed to permit attenuation of the noise signals.

29 Claims, 3 Drawing Figures

4,133,050

EARLY NOISE PULSE AND LONG DURATION, STABILIZED SWITCHING PULSE

BACKGROUND OF THE INVENTION

1. Field of the Invention

This invention relates to large magnetic core memories having a partial select current providing a total drive current at a selected core that rapidly increases to the coercive MMF of the core and then slowly increases toward the full drive current.

2. Discussion of the Prior Art

Magnetic core memories have long been used to store data for digital applications. They have been built in many different configurations, but the currently most popular configurations are a 3 wire-3 dimensional memory utilizing a double herringbone core pattern inductively coupled by orthogonal drive conductors and a sense-inhibit conductor pair and a 2 wire, 2½ dimensional type of memory. Many improvements have been made to increase memory speed and to increase the number of cores for each sense-inhibit conductor pair, thereby decreasing memory costs. Core spacing has been decreased, core size has been decreased and core composition has been improved.

Currently, memories are being commercially manufactured with 16K or 32K (K=1024) 13 mil outside diameter cores coupled to each sense-inhibit conductor pair and 64K cores are being contemplated. However, the energy of a core switching signal is proportional to core volume and hence the small, thin 13 mil cores produce a very small amplitude short duration core output switching signal. While the signal energy is being decreased by smaller core sizes, the noise and signal propagation times are being increased as a result of the increasing number of cores on a sense-inhibit conductor pair. A small noise pulse, called delta noise, is generated by each partially selected core as the drive current is generated. The sense-inhibit conductors are arranged for partial cancellation, but delta noise varies slightly with memory state and other factors such as drive amplitude, drive duration, temperature and previous disturb history and complete cancellation is impossible. The uncancelled delta noise thus increases with the number of cores and approaches the switching signal in magnitude. These noise problems are exacerbated by the use of low drive cores, which tend to have smaller magnitude output switching pulses and less defined switching characteristics than high drive cores. They, of course, have the advantage of reducing power requirements.

FIG. 2 illustrates the criticality of distinguishing a core switching pulse from the noise signals. It illustrates typical worst case operating conditions in a memory having 16K 1370 Ampex Corporation cores per sense-inhibit conductor pair in a 3 wire-3 dimensional memory. The 1370 core is a temperature independent punched tape core having a 13 mil outside diameter and a nominal total drive current of 700 ma. It is a moderately high drive type of core.

Curves A and C represent respectively the switching and noise pulses at 10% high drive current at +110° C. while curves b and d illustrate the switching and noise pulses at 10% low drive current at −60° C. temperature. These are the worst case opposite extremes for this core. Commercially practical sense amplifiers require detection of a voltage signal during a minimum 25-30 nsec strobing interval with a selected voltage threshold greater than 8 millivolts.

As seen from FIG. 2, a mere 20 nsec strobing interval at a threshold of 10.0 mv barely fits within the worst case conditions. An inadequate time tolerance of 6 nsec exists on each side of the strobing interval to account for variations in switching signal propagation times along the sense conductors and the noise remains dangerously close to the threshold level as represented by curve C. Even though the current on the perpendicular conductor is delayed relative to the greater noise generating parallel current, the noise remains extremely high during the strobing interval. At the same time under the nominal conditions of curve B, the switching signal magnitude is barely above the threshold at the start of the strobing interval. Even the slightest variation in switching signal characteristics of a core will require the core to be replaced in the memory at great expense.

To meet the extremely tight core tolerances required by the prior art memory configuration represented by FIG. 2, it is necessary to subject the memory cores to 100% inspection. This inspection eliminates about one-half of the cores, thus doubling the bulk core costs. The handling required for inspection also creates mechanical damage, thus increasing the number of unacceptable cores, some of which may escape the inspection process and be wired into a memory. Once a memory is wired it must be thoroughly tested and any core that deviates from a narrow tolerance range in switching characteristics must be replaced. The longer sense lines of course increase the cost of rework and the additional handling required for rework inflicts additional damage upon the cores. Inspection and rework now account for more than half the cost of a core memory.

SUMMARY OF THE INVENTION

A large, wide tolerance core memory in accordance with the invention includes an array of low drive magnetic cores which are selectively switchable between different states of magnetization, sensing circuitry including at least one sense conductor extending through the array of cores in a given direction and inductively coupling cores of the array, at least one parallel conductor, extending through the core array in a direction parallel to the sense conductor and inductively coupling at least one core in the array, at least one perpendicular conductor extending through the core array in a direction perpendicular to the sense conductors and inductively coupling at least one core in the array, parallel drive circuitry connected to drive a selected parallel conductor with a partial select parallel drive current which slowly increases continuously in magnitude throughout a long parallel current rise time interval, and perpendicular drive circuitry connected to drive a selected perpendicular conductor with a partial select perpendicular rapid rise time drive current to tend to switch a selected core that is inductively coupled by a selected parallel conductor and a selected perpendicular conductor to a given state of magnetization, the perpendicular drive current increasing rapidly to a maximum magnitude equal to half the nominal full drive current for the cores during a short, early perpendicular current rise time interval.

The steep rate of increase of the perpendicular partial select current causes it to reach its maximum amplitude sufficiently early in the memory cycle that the partial selection delta noise generated thereby can rapidly begin attenuating prior to generation of a sense amplifier strobe pulse during the strobing interval. It is generally desired that the peak noise voltage be less than 10% of the voltage sensing interval during the sensing threshold. Furthermore, while the perpendicular relationship of the perpendicular and sense conductors minimizes the coupling therebetween, the rapid rate of current increase does cause some inductive and capacitive coupling of noise from the perpendicular conductor onto the sense conductor. However, this coupling noise also occurs early in the read portion of a memory cycle and can attenuate along with the delta noise.

There are two preferred methods of driving the parallel current in accordance with the invention. Both utilize a relatively long, gradual current ramp with the parallel drive current continuously increasing in magnitude during a parallel current rise time interval that preferably begins simultaneously with the perpendicular current rise time interval. The parallel current rate of increase and the parallel current rise time interval are selected such that a selected core begins switching under the parallel current ramp and, assuming insignificant propagation delay, the output switching pulse exceeds the threshold switching voltage within the rise time interval. Following the rise time interval, the parallel current can level out and remain constant at one half the nominal total switching current for the cores until the strobing interval is completed and the core flux is substantially switched and then decline at a moderate rate simultaneously with the perpendicular current. Alternatively, the parallel drive current may continue increasing until it reaches a peak at or shortly after the peak of the output switching pulse and then immediately begin decreasing along a gradual slope about equal to the parallel current rise slope. The peak magnitude of the parallel drive current can then be slightly greater than one-half the nominal drive current of the core since the triangular shaped partial select drive current will exceed or equal the coercive MMF of the partially selected cores for insufficient time to cause significant switching in the partially selected cores.

By requiring a selected core to begin switching during the relatively gradual parallel current increasing ramp, the switching energy is applied to the core more slowly. This causes the output switching pulse to be somewhat delayed relative to the noise generated by the perpendicular current so that this noise can attenuate and not interfere with the sensing of the switching pulse during the strobing interval. The gradual application of energy also tends to produce a lower peak magnitude, longer duration switching pulse. The amplitude is still more than adequate for commercially practical sense amplifiers and the longer duration allows additional time for the strobing interval, for variations in propagation delay, and for variations in core switching characteristics. The troublesome problem of too fast switching and peaking in small cores is thus overcome. Also the rising edge or "front" of a "fast peaking" signal is not cancelled by delta and coupling noise occurring at the same time. The postponement of signal peaking time tp and switching time ts allows a wide duration for the gating time with the strobe pulse having a wide time and level tolerance. Because of the gradual slope of the rising parallel current, there is minimal generation of uncancelled parallel current delta noise and minimal coupling of parallel current signal noise into the sense conductors.

In addition, because a core switches on the rising slope of the drive current, the switching pulse closely follows this slope and is greatly stabilized with respect to variations in drive current magnitude, temperature, and core characteristics. Not only are greater tolerances acceptable by a memory in accordance with the invention, but variations in core switching signals due to factors other than propagation delay such as a non-uniform composition or physical size are reduced. Larger memory sizes with smaller cores having less rework are thus fascilitated and memory costs are greatly reduced.

BRIEF DESCRIPTION OF THE DRAWINGS

A better understanding of the invention may be had from a consideration of the following detailed description taken in conjunction with the accompanying drawings in which.

DETAILED DESCRIPTION

Figure 1:
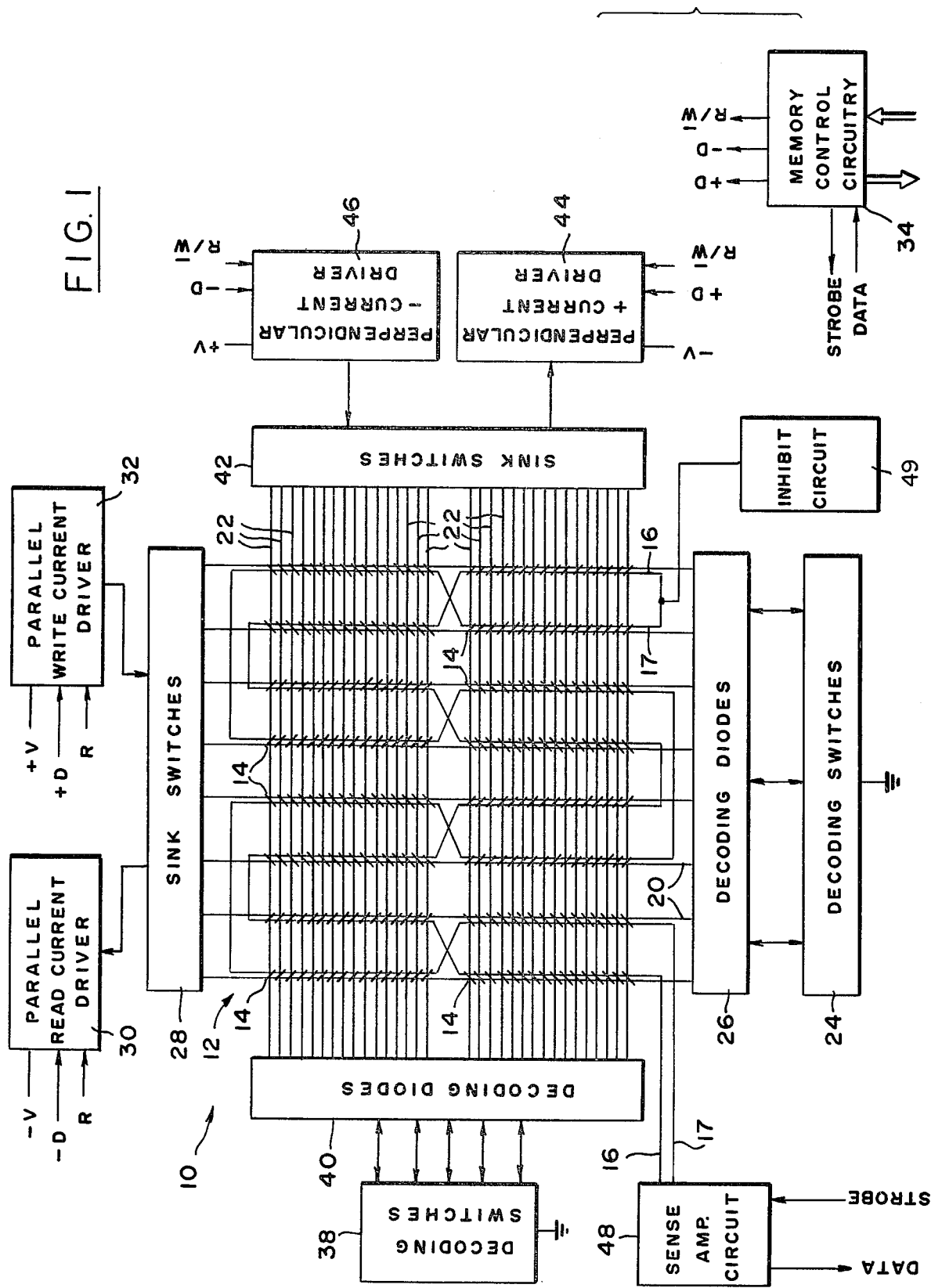
FIG. 1 is a schematic and block diagram representation of a core memory in accordance with the invention.

Referring now to FIG. 1, a core memory 10 in accordance with the invention includes an array 12 of memory cores 14 which are arranged in a conventional double herringbone pattern. The cores 14 are inductively coupled by a pair of sense inhibit conductors 16, 17 which extend through the core array 12 in a given direction in a parallel side-by-side relationship with periodic crossovers for noise cancellation, parallel drive conductors 20 each of which extends through a column of cores in the array 12 in a direction parallel to the sense-inhibit conductors 16, 17, and a plurality of perpendicular drive conductors 22, each of which extends through a row of cores in the array 12 in a direction perpendicular to the sense-inhibit conductors 16, 17. Within a core the perpendicular drive conductor is disposed between and separates the parallel drive conductor from the sense-inhibit conductor. In addition, it will be appreciated that in a 2 wire, 2D or 2½D memory the sense wires 16, 17 and the parallel drive conductors 20 are merged into a single conductor performing both the drive and sense function. There is no inhibit function.

Although only a small array 12 of cores 14 is illustrated in FIG. 1, for the purpose of explaining the invention, it will be appreciated that it is conventional for a core memory to have an array of cores with 16K or 32K cores inductively coupled to a sense-inhibit conductor pair 16, 18 and with the parallel drive conductors 20 and the perpendicular drive conductors 22 inductively coupling additional arrays of cores, each of which is inductively coupled by a different sense-inhibit conductor pair. For example, a typical core memory might have 18 or 20 sense-inhibit conductor pairs, each of which inductively couples 16K or 32K cores. Even greater numbers of cores for each sense-inhibit conductor pair are contemplated.

The cores 14 are preferably a temperature independent type of core to eliminate the need for complex temperature compensation circuitry and are preferably disposed in a high density configuration to minimize the length of the sense-inhibit conductors. A core such as the 1370 TIN core manufactured by Ampex Corporation with a 13 mil outside diameter and a 700 milliamp nominal drive current may be utilized for the cores 13. However, the invention is particularly advantageous where a low drive core such as the 1332 TIN core manufactured by Ampex Corporation with a 13 mil outside diameter and a 320 milliamp nominal drive current is utilized to attain the combined advantages of a large number of cores per sense-inhibit conductor and a low drive current.

The parallel drive conductors 20 are connected to decoding switches 24, decoding diodes 26, sink switches 28 and parallel read and write current drivers 30, 32 which operate in a generally conventional manner to control the current through a selected parallel drive conductor 20 in response to address signals (not shown), read-write commands, R/$\overline{W}$, and current direction commands +D, −D, from memory control circuitry 34. The decoding switches 24, decoding diodes 26 and sink switches 28 control the particular parallel drive conductor 20 through which a partial select current passes during a memory read or write part cycle while the parallel read and write current drivers 30, 32 control the shape, magnitude and timing of the partial select current pulses. These current drivers 30, 32 are constructed in accordance with conventional design principles to produce a particular slow rise time drive current pulse which is further described below in conjunction with FIG. 2.

In a similar manner, current through the perpendicular conductors 22 is controlled in response to decoding switches 38, decoding diodes 40, sink switches 42, and perpendicular opposite direction plus and minus current drivers 44, 46, in response to address signals (not shown) and signals +D, −D and R/$\overline{W}$ from memory control circuitry 34. The decoding switches 38, decoding diodes 40, and sink switches 42 control the particular perpendicular conductor 22 through which current passes while the perpendicular plus and minus current drivers 44, 46 determine the direction, shape, and timing of the perpendicular current pulses. This invention is primarily concerned with the read current pulses which are described in greater detail in conjunction with FIG. 2 below. The perpendicular plus and minus current drivers 44, 46 may be constructed in accordance with conventional design principles to produce the required current pulse shapes and timing.

Memory control circuitry 34 may be generally conventional in nature and produces the timing and control signals for operating the memory 10. In particular, signal R/$\overline{W}$ controls parallel plus and minus current drivers 30, 32 to command the generation of predetermined read or write current pulses which may or may not have the same general shape. Similarly, signals +D and −D control the activation of perpendicular plus and minus current drivers 44, 46 to control the timing and direction of current pulses through a selected perpendicular drive conductor 22. Because of the double herringbone high density core pattern configuration of the particular core matrix 12, the required direction of the partial select drive currents during a read or write part memory cycle may depend upon the core address and thus signals +D and −D are generated in a conventional manner to control the proper current direction. Similarly, signal R/$\overline{W}$ is generated during a read portion of a memory cycle to command the perpendicular plus and minus current drivers 44, 46 to generate a current pulse of the required shape and magnitude for reading in accordance with the invention.

The sense-inhibit conductors 16, 17 are connected at one end to a differential sense amplifier circuit 48 which responds to a strobe signal generated in a conventional manner by memory control circuitry 34 to generate a data signal when a differential voltage appears across the sense-inhibit conductor pair 16, 17 in excess of a selected threshold magnitude during the occurrence of the strobe pulse.

At the end opposite the sense amplifier circuit 48, the sense-inhibit conductors 16, 17 are connected together and to an inhibit circuit 49. The inhibit circuit 49 operates in a conventional manner to provide a partial select current which opposes and cancels the partial select current in a selected perpendicular drive conductor 22 to prevent the writing of a "1" (i.e. switching of core flux to a 1 state) during a write portion of a memory cycle.

Figure 2:
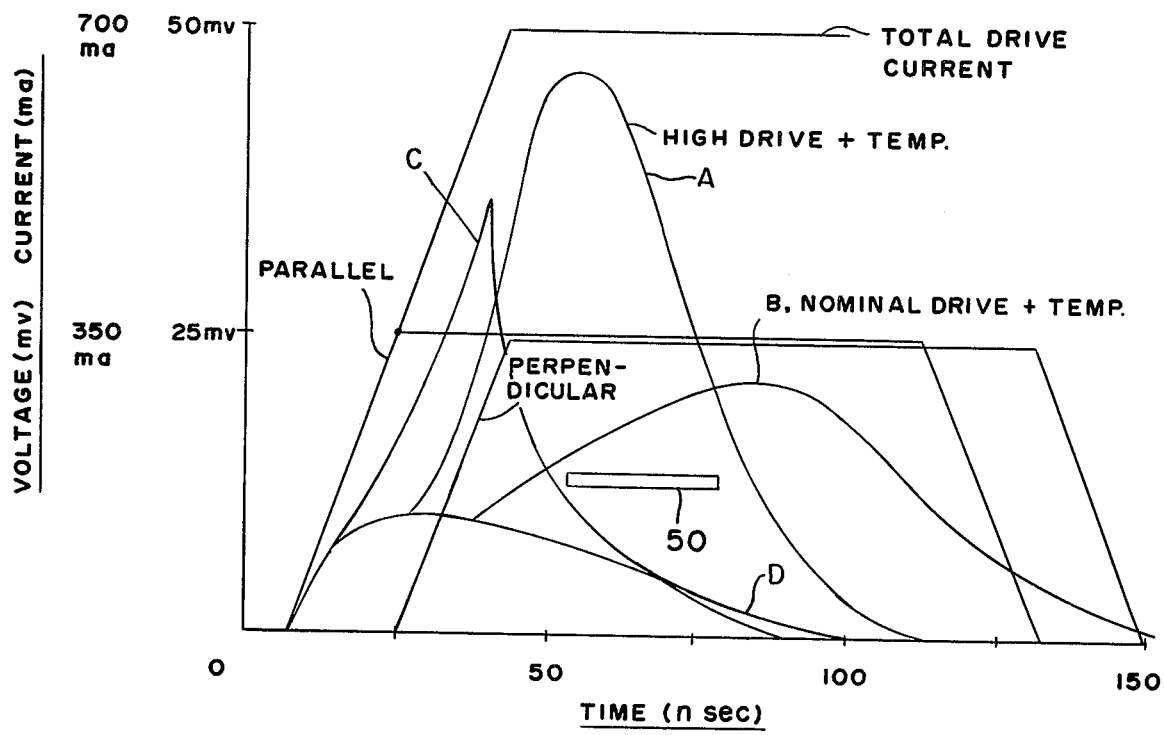
FIG. 2 is a diagram illustrating the switching characteristics of a prior art core memory.

Referring to FIG. 2, there is shown therein a waveform switching diagram for a conventional core memory. The core is a 1370 TIN core manufactured by Ampex Corporation having a 13 mil outside diameter and a moderately high test full drive current of 700 milliamps. The core is conventionally driven by a parallel partial select current which rises from 0 to approximately 350 milliamps and at a moderate rate of increase or dI/dt of 8 milliamps per nanosecond. The parallel partial select drive current then remains at 350 milliamps, which is slightly below the coercive magnetomotive force of the core while the perpendicular partial select drive current rises from 0 to 350 milliamps at the same rate of 8 milliamps per nanosecond.

The TIN core material of the 1370 TIN core is compensated to reduce variations of core electrical characteristics with temperature. However, while great improvements have been achieved, total elimination of all variations in electrical characteristics with temperature have not yet been attained. In addition, practical economic restraints on the hardware used in the current drivers requires that there be a tolerance variation of up to 15% on the magnitude of the current over the military temperature range of −60° C. to +110° C. Component costs rise exponentially as tolerances are tightened. These current and temperature variations with time and position in an array (Temperature gradients) represent the most influential factors in determining the shape, i.e. voltage level and timing of a core output switching signal as well as the sensed noise signal.

FIG. 2 represents the worst case extreme switching conditions for a conventional memory drive configuration using the 1370 TIN Ampex core. Curves A and C represent the state 1 and state 0 read output switching pulses respectively at a 10% high drive and a high temperature of +110° C. The other worst case conditions represented by curves B and D for the read state 1 and 0, respectively, occur at conditions of low drive current (700 milliamps) and a nominal temperature of 25° C.

It will be observed that curve A is a comparatively high amplitude, narrow, fast peaking curve while curve B is a comparatively low amplitude, time extended, slow peaking curve. Similarly, the read 0 noise signals have considerably greater amplitude at high drive and temperature conditions.

A sensing or strobing window 50 must have a minimum threshold voltage of about 8–20 millivolts and a minimum time duration of 25 to 30 nanoseconds for practical sense amplifiers. The strobe time and voltage threshold must be selected such that the window is located with all read 0 switching noise differential voltages at a magnitude less than the threshold level while all read 1 differential voltage switching signals have a magnitude greater than the threshold level during the strobing interval. It can be seen from FIG. 2 that with a conventional drive arrangement, there is not quite a sufficient signal to noise voltage separation during a minimum 25 nanosecond interval for the occurrence of the window. If additional tolerance requirements are allowed for the sensing threshold, the strobing interval time, signal propagation time through a long sense conductor pair of a large bit size memory, and variations in the sense amplifier circuit, it can be seen that operation of a large memory without error becomes marginal at best. Even tiny variations in the core characteristics themselves could cause errors in memory operation.

Figure 3:
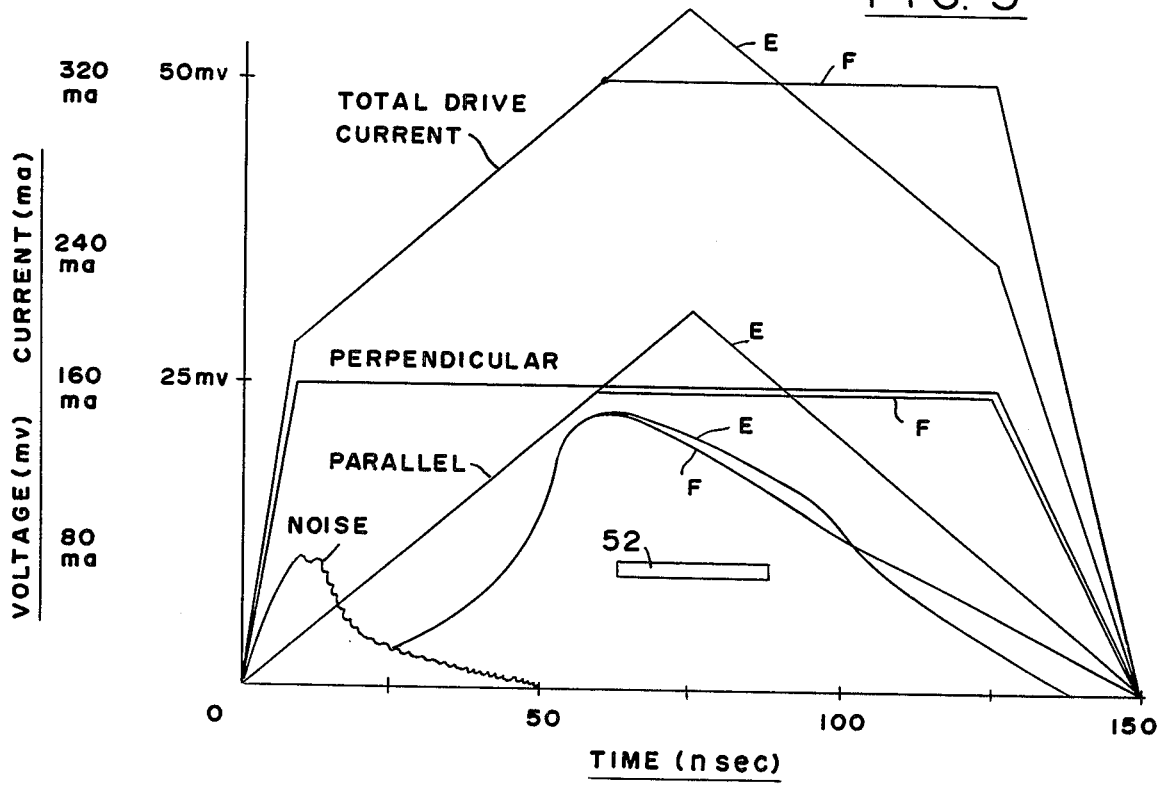
FIG. 3 is a diagram illustrating the switching characteristics of a core memory in accordance with the invention as illustrated in FIG. 1.

These problems are greatly alleviated by driving the core memory with drive currents as illustrated in FIG. 3. The core utilized for the example of FIG. 3 is the 1332 TIN core manufactured by Ampex Corporation. This is a low drive core which would have even greater extremes of core output voltage switching signal characteristics than the 1370 core illustrated in FIG. 2 if operated under conventional conditions. However, by driving the core with a preferred drive current waveform pattern in accordance with the invention, the output switching signal waveform pattern characteristics become greatly stabilized with respect to variations in temperature and current magnitude and use of the core in large 16K or even 32K bit size memories becomes practical.

The core is driven with a drive current perpendicular to the sense-inhibit conductors 16, 17 which rises rapidly from 0 to the 160 milliamp nominal partial select current level just below the coercive MMF of the core at a dI/dt current rise time rate of approximately 17 milliamps per nanosecond. Simultaneously, the drive conductor parallel to the sense-inhibit conductors 16, 17 is driven from 0 toward the 160 milliamp partial select current magnitude at a much slower dI/dt rise time rate of approximately 2.7 milliamps per nanosecond. The core, of course, sees the sum of these currents or a total current which rises very rapidly to a current of approximately 180 milliamps, which approximately provides the coercive magnetomotive force of the core and then continues to rise much more slowly toward the total nominal drive current for the core. The rate of increase of drive current during the second or slow rise time stage of the read partial cycle is selected to be sufficiently slow that the core output switching signal for state "1" does not peak until after the time at which the noise for a state "0" output switching signal has substantially subsided and such that the state "1" switching signal peaks while the drive current is still increasing.

There are two preferred alternative shapes for the parallel drive current magnitude pattern, one of which produces a parallel drive current, total current and output switching pulse pattern as represented by character E in FIG. 2. In this pattern the parallel drive current has a triangular waveform which increases from 0 to approximately 200 milliamps in about 75 nanoseconds and then immediately decreases linearly back to 0 in another 75 nanoseconds. This arrangement produces a partial select current having a maximum amplitude of 200 milliamps which closely approaches or exceeds the coercive magnetomotive force of the selected core and is somewhat greater than would be used for the maximum partial select current in a conventional memory configuration. In a conventional memory such a large current would cause partially selected cores which are not being read to begin switching the flux therein when they are not supposed to do so. After repeated partial selection of these cores, sufficient flux would switch that errors would occur in subsequently reading the state of these cores. This phenomenon is known as walking. However, in the present configuration, the triangular shape of the drive current amplitude causes the partial select drive current to be at this large amplitude for a sufficiently short time that walking does not become a problem. This switching pattern which has been designated E has the advantage of producing an output switching pulse with slightly better characteristics because it tends to remain at a higher and flatter magnitude for a longer period of time and then decrease more rapidly in magnitude.

The alternative current drive pattern has signals associated therewith represented by character F and results in the use of a trapezoidal shaped parallel drive current. Upon reaching the nominal 160 milliamp partial select current magnitude, the parallel drive current remains constant for a period of time while the flux of the selected core is switched. The parallel and perpendicular drive currents are then terminated simultaneously with an intermediate dI/dt fall time rate of approximately −3.2 milliamps per nanosecond.

It will be noted that the output switching signal for method F adds a shape which peaks substantially simultaneously with the switching signal for pattern E but with a slightly smaller peak magnitude. The amplitude decreases from the peak slightly less rapidly initially for pattern E and then more rapidly toward the end of the read portion of the switching cycle. The tail of the switching curve F is not sharply truncated as in the case of drive method E. The switching pulse waveform for method E is more rectangular than that for method F, but both are considerably more rectangular than for prior art switching methods. The switching flux is better utilized because it maintains the switching pulse above the threshold and separated from the noise for a longer time.

Because the drive scheme in accordance with either alternative of the invention greatly stabilizes the core output switching signal with respect to temperature and drive current variations even for a low drive core, a tremendous increase in the available tolerance variations for such factors as signal propagation time, strobe time, voltage sensing threshold level, and core characteristics becomes possible. It will be noted that for the drive configuration in accordance with the invention a time tolerance of approximately 15 nanoseconds occurs on each side of the minimum strobing window 52 compared to a tolerance of only about 6 or 7 nanoseconds for the strobing window 50 in the conventional arrangement illustrated in FIG. 2. It will be further noted that the noise margin is substantially improved because the state 0 noise switching pulse has decayed to virtually 0 before the occurrence of the strobe pulse. The ratio of the peaking time tp of the read "1" switching pulse to the read "0" noise pulse is much greater in the new arrangement than for the prior arrangements. In the new arrangement it is approximately 6.95 compared to 1.6 in prior art arrangements with peaking time being measured from initiation of any drive current. This is possible because of the advantageous nature of the drive current pattern which causes the noise pulse to occur early and causes the switching pulse to be delayed. The perpendicular current is the fast rise time current and therefore generates the partial select delta noise which is coupled into the sense-inhibit conductors. In addition, the very rapid rise time causes inductive and capacitive coupling into the sense-inhibit conductors. However, because of the rapid, early occurrence of this rapid rise time rate perpendicular current, the noise created thereby also dissipates at an early time. Furthermore, because the perpendicular conductors are contiguous to the sense-inhibit conductors over very small areas due to their perpendicular orientations, the rapid rise time of the current in the perpendicular conductors is partially offset by the lack of coupling between the perpendicular conductors and the sense-inhibit conductors.

Simultaneously, the parallel drive currents increase at a comparatively slow rate which causes minimal inductive and capacitive coupling into the sense-inhibit conductors. What noise coupling does occur is largely cancelled by the conventional noise cancellation technique or periodically crossing the sense-inhibit conductors 16, 17 part way through the core array as illustrated in FIG. 1. Because of the slow rise time of the parallel current, there is very little partial select delta noise coupling into the sense-inhibit conductors.

It can thus be seen that a drive scheme arrangement in accordance with the present invention produces noise signals which occur early in a read portion of a memory cycle along with state "1" output switching pulse signals which occur relatively late in a memory cycle and have a comparatively long time duration flat peak to provide substantial time tolerances on the time and magnitude of occurrence of the strobe signal and the output switching pulse. Because the noise is substantially dissipated by the time of the occurrence of the switching pulses, the sensing threshold voltage can be set at a comparatively low level of about 8 millivolts to accommodate the low magnitude output switching signal peak voltage of a low drive core. Notwithstanding the delay in the occurrence of the switching signal, the total read portion of a memory cycle can be substantially the same as for a conventional memory drive scheme.

While there have been shown and described above various arrangements of a core memory in accordance with the invention for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

What is claimed is:

1. A magnetic core memory comprising:
   an array of magnetic memory cores, each being switchable between two different states of magnetization in response to a current inductively coupled thereto;
   a plurality of conductors inductively coupling the cores of the array, the conductors carrying switching signals induced thereon by a core switching from one stable state to another and currents for selective, coincident current switching of cores within the array, the conductors including at least one sense conductor extending through the array and having a core output switching signal inductively coupled thereto, a plurality of parallel drive conductors extending through the array in the same direction as the sense conductor, and a plurality of perpendicular conductors different from the sense conductor and extending through the array in a direction perpendicular to the sense conductor;
   perpendicular drive circuitry connected to drive a selected perpendicular conductor with a partial select perpendicular current having a perpendicular current rise time interval that is much shorter than a peaking time interval for a core switching signal generated by a selected core switching from one stable state to another to reach a peak voltage amplitude; and
   parallel drive circuitry connected to drive a selected parallel conductor with a partial select parallel current having a rise time interval that continues until at least approximately the peaking time.

2. The core memory according to claim 1 above, wherein the parallel drive circuitry drives a selected parallel conductor with a partial select parallel current that is initiated concurrently with the perpendicular current and increases in magnitude as a linear ramp.

3. The core memory according to claim 1 above, further comprising sensing circuitry connected to sense a core switching signal generated by a core switching from one stable state to another, the sensing circuitry being operable only during the occurrence of a strobe signal to sense a core switching signal voltage in excess of a threshold magnitude; and memory control circuitry connected to generate the strobe signal during the rise time interval of the parallel current.

4. The core memory according to claim 3 above, wherein the memory control circuitry is operative to generate the strobe signal continuously from a strobe start time prior to the end of the parallel current rise time interval to a strobe stop time subsequent to the end of the parallel current rise time interval.

5. The core memory according to claim 4 above, wherein the parallel current rise time interval terminates approximately midway between the strobe start time and the strobe stop time.

6. The core memory according to claim 1 above, wherein the parallel current magnitude has a triangular shape which increases to a peak during the parallel current rise time interval and then immediately begins decreasing during a parallel current fall time interval.

7. The core memory according to claim 6 above, wherein the parallel current fall time approximately equals the parallel current rise time.

8. The core memory according to claim 1 above, wherein the parallel current remains at a constant maximum magnitude during a constant magnitude time interval and then returns to zero during a fall time interval that is shorter than the parallel current rise time interval.

9. The core memory according to claim 8 above, wherein the perpendicular current remains at a constant maximum magnitude during a perpendicular current constant magnitude interval following the perpendicular current rise time interval and then returns to zero during a perpendicular current fall time interval that is coextensive with the parallel current fall time interval.

10. The core memory according to claim 1 above, wherein the memory is a 3 wire-3 dimensional memory and wherein the plurality of conductors includes a plurality of sense-inhibit conductor pairs, each conductor pair being inductively coupled to at least 32K cores.

11. The core memory according to claim 10 above, wherein the memory cores have an outside diameter no greater than 0.013 inch.

12. The core memory according to claim 11 above, wherein each sense-inhibit conductor pair inductively couples at least 64K cores.

13. The core memory according to claim 3, wherein the threshold magnitude is no greater than 0.015 volt.

14. A magnetic core memory comprising:
an array of toroidal magnetic memory cores which are selectively switchable between different states of magnetization, each core generating a switching signal in a sense conductor inductively coupled thereto when being switched, the switching signal having a maximum voltage amplitude at a peaking time occurring at the end of a peaking interval that begins with the initiation of a partial select current that is inductively coupled to a core being switched;

sensing circuitry including at least one sense conductor extending through the array of cores in a given direction and inductively coupling cores of the array and including at least one sense amplifier circuit that is responsive to voltage levels appearing on the sense conductor and to a strobe signal to generate a data output signal when a voltage level on the sense conductor exceeds a threshold magnitude for a given time interval during the occurrence of a strobe signal provided during a strobe interval;

a plurality of parallel conductors, each extending through the core array in a direction parallel to the sense conductor and inductively coupling a plurality of cores in the array;

parallel drive circuitry connected to drive a selected parallel conductor with a partial select parallel drive current which increases continuously in magnitude during a parallel current rise time interval to reach a maximum amplitude at the end thereof, the rate of increase of parallel current magnitude being sufficiently small and the parallel current rise time interval being sufficiently long that the voltage level on the sense conductor becomes less than the threshold magnitude within the parallel current rise time interval when a selected core does not switch and becomes greater than the threshold magnitude within the parallel current rise time interval when a selected core switches between different stable states;

a plurality of perpendicular conductors, each extending through the core array in a direction perpendicular to the sense conductors and inductively coupling a plurality of cores in the array;

perpendicular drive circuitry connected to drive a selected perpendicular conductor with a partial select perpendicular drive current to tend to switch a selected core that is inductively coupled by a selected parallel conductor and a selected perpendicular conductor to a given state of magnetization, the perpendicular current increasing rapidly to a maximum magnitude at the end of a perpendicular current rise time interval that is shorter than the parallel current rise time interval and then remaining constant at the maximum magnitude during a perpendicular current constant magnitude interval that extends at least until the end of the parallel current rise time interval.

15. The core memory according to claim 14 wherein the parallel drive current has a maximum rate of increase of 2.7 amperes per microsecond.

16. The core memory according to claim 14 wherein the parallel drive current has a generally symmetrical triangular shape with a parallel current fall time interval equal to the parallel current rise time interval.

17. The core memory according to claim 16 wherein the perpendicular drive current decreases in magnitude during a perpendicular current fall time interval that is much shorter than the parallel current fall time interval and ends at the same time as the parallel current fall time interval.

18. The core memory according to claim 16 above, wherein the memory cores have an outside diameter no greater than 0.013 inch, the magnitude of the sum of the parallel and perpendicular drive currents does not exceed 360 milliamps and the time interval between initiation of the first partial select current and termination of the last partial select current does not exceed $150 \times 10^{-9}$ second.

19. The core memory according to claim 14, wherein the parallel current rise time interval is followed by a parallel current constant magnitude interval which is in turn followed by a current fall time interval during which the parallel and perpendicular drive currents both decrease in magnitude.

20. The core memory according to claim 20 above, wherein the fall time interval is shorter than the parallel current rise time interval and longer than the perpendicular current rise time interval.

21. A 3 wire core memory comprising an array of at least 32768 memory cores inductively coupled by a single sense-inhibit conductor pair extending through the array in a given direction, parallel drive conductors extending through the array in the given direction, perpendicular drive conductors extending through the array in a direction perpendicular to the given direction, and drive circuitry connected to operate during a read portion of a memory cycle to energize a selected parallel conductor with a parallel drive current and a selected perpendicular conductor with a perpendicular drive current, the perpendicular drive current having a comparatively fast rate of increase during a comparatively short perpendicular current rise time interval and the parallel current having a comparatively slow rate of increase during a comparatively long parallel current rise time interval that begins simultaneously with the perpendicular current rise time interval, the parallel current having a sufficiently slow rate of increase to permit electrical noise coupling from the selected perpendicular conductor and from partially selected cores differentially into the sense-inhibit conductor pair to attenuate to a level that is insignificant relative to a sensing voltage threshold prior to occurrence of a core switching signal and having a sufficiently long parallel current rise time interval to permit a substantial portion of a core switching pulse generated on the sense-inhibit conductor pair by the switching of a magnetic core to occur while the parallel drive current is increasing in magnitude, and a sense amplifier circuit connected to sense core switching pulses appearing differentially across the sense-inhibit conductor pair above a sensing voltage threshold during a strobing time interval which occurs during the switching pulse and subsequent to attenuation of said electrical noise to a level that is insignificant relative to the sensing voltage threshold.

22. A core memory comprising a plurality of magnetic memory cores that are switchable between different stable states of magnetization in response to a drive current exceeding a coercive magnetomotive force thereof; a plurality of conductors inductively coupling the cores and carrying drive currents selectively switching the cores between stable states and core output switching signals generated by cores switching between stable states; sensing circuitry coupled to sense core output switching signals appearing on said conductors; and current drive circuitry coupled to said conductors to provide at a selected core a drive current causing the selected core to tend to switch from one stable state to another and to generate a core output switching signal as switching occurs, the drive current having a current waveform shape that increases less rapidly between a maximum amplitude and an amplitude providing the coercive magnetomotive force of the selected core than between zero and the amplitude providing the coercive magnetomotive force of the selected core.

23. The core memory according to claim 22 above, wherein the sensing circuitry detects the presence of an output switching signal above a selected threshold amplitude, the output switching signal of a switching core having an amplitude greater than the selected threshold amplitude while the drive current is still increasing in magnitude.

24. The core memory according to claim 22 above, wherein the output switching pulse generated by a core switching between stable states has a peak amplitude which occurs at a time tp1 after initiation of the drive current and a noise pulse generated when a selected core does not switch between stable states in response to a drive current has a peak amplitude which occurs at a time tp0 after initiation of the drive current, the ratio of tp1 to tp0 being greater than 1.6.

25. The core memory according to claim 24 above, wherein the ratio at tp1 to tp0 is at least 6.9.

26. The core memory according to claim 23 above, wherein the drive current increases continually toward a maximum amplitude during a rise time interval from a magnitude less than the coercive magnetomotive force of the cores.

27. The core memory according to claim 22 above, wherein the output switching pulse generated by a core switching between stable states has a generally rectangular waveform shape.

28. The method of operating a core memory having an array of memory cores, sense conductors inductively coupled to sense voltage pulses generated by a switching of magnetic flux within a memory core and at least one drive conductor inductively coupled to selectively switch the magnetic flux within a selected memory core having a coercive force below which significant flux does not switch, comprising the steps of driving the at least one drive conductor with a current pattern which causes the current inductively coupled to the selected core to rapidly increase to a current magnitude which matches the coercive force of the core and then further driving the at least one drive conductor with a current pattern which causes the current inductively coupled to the selected memory core to continue to increase at a slower rate which is selected to cause the core to generate an output switching pulse in a sense conductor inductively coupled to the core which switching pulse has a peak amplitude which occurs while the current inductively coupled to the selected memory core continues to increase.

29. The method according to claim 28 above wherein the step of further driving includes the step of driving the at least one drive conductor with a current pattern which causes the current inductively coupled to the selected memory core to have a maximum amplitude of 320 milliamperes.

* * * * *